(12) United States Patent
He et al.

(10) Patent No.: US 10,186,490 B2
(45) Date of Patent: Jan. 22, 2019

(54) MANUFACTURING METHOD OF DISPLAY PANEL AND BONDING CUTTING DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Quanhua He, Beijing (CN); Hao Zhang, Beijing (CN); Lingyun Shi, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 20 days.

(21) Appl. No.: 15/324,595

(22) PCT Filed: Feb. 16, 2016

(86) PCT No.: PCT/CN2016/073839
§ 371 (c)(1),
(2) Date: Jan. 6, 2017

(87) PCT Pub. No.: WO2017/041436
PCT Pub. Date: Mar. 16, 2017

(65) Prior Publication Data
US 2017/0200681 A1    Jul. 13, 2017

(30) Foreign Application Priority Data
Sep. 8, 2015 (CN) .......................... 2015 1 0566255

(51) Int. Cl.
*H01L 23/544* (2006.01)
*H01L 21/48* (2006.01)
(Continued)

(52) U.S. Cl.
CPC ...... *H01L 23/544* (2013.01); *G02F 1/133351* (2013.01); *H01L 21/4853* (2013.01);
(Continued)

(58) Field of Classification Search
None
See application file for complete search history.

(56) References Cited

U.S. PATENT DOCUMENTS

2007/0290375 A1    12/2007 Huang
2009/0045752 A1    2/2009 Azuma et al.
(Continued)

FOREIGN PATENT DOCUMENTS

CN    1576969 A      2/2005
CN    202738377 U    2/2013
(Continued)

OTHER PUBLICATIONS

First Office Action dated Aug. 28, 2017 in corresponding Chinese Patent Application No. 201510566255.9.
(Continued)

*Primary Examiner* — Reema Patel
(74) *Attorney, Agent, or Firm* — Nath Goldberg & Meyer; Joshua B. Goldberg (57) ABSTRACT

The present application provides a manufacturing method of a display panel and a bonding cutting device, belongs to a field of display technology, and can solve a problem of low production efficiency of display panels in the prior art. The display panel comprises a display region and a bonding region, the manufacturing method of the present application comprises steps of: cutting a display motherboard along cutting lines, and simultaneously bonding flexible circuit boards to bonding regions of the cut display panels corre-
(Continued)

sponding thereto. The manufacturing method of the display panel in the present application is suitable for mass production of display panels.

16 Claims, 4 Drawing Sheets

(51) Int. Cl.
| | |
|---|---|
| *H01L 21/67* | (2006.01) |
| *H01L 21/68* | (2006.01) |
| *H05K 3/00* | (2006.01) |
| *H05K 3/36* | (2006.01) |
| *G02F 1/1333* | (2006.01) |
| *H05K 1/18* | (2006.01) |

(52) U.S. Cl.
CPC .. *H01L 21/67092* (2013.01); *H01L 21/67144* (2013.01); *H01L 21/681* (2013.01); *H05K 3/0052* (2013.01); *H05K 3/0097* (2013.01); *H05K 3/361* (2013.01); *H01L 2223/5446* (2013.01); *H01L 2223/54426* (2013.01); *H01L 2223/54486* (2013.01); *H05K 1/189* (2013.01); *H05K 2201/10128* (2013.01); *H05K 2203/0228* (2013.01); *H05K 2203/163* (2013.01); *H05K 2203/166* (2013.01)

(56) References Cited

U.S. PATENT DOCUMENTS

| | | |
|---|---|---|
| 2014/0092334 A1 | 4/2014 | Ishikawa et al. |
| 2015/0004306 A1 | 1/2015 | Cho |

FOREIGN PATENT DOCUMENTS

| | | |
|---|---|---|
| CN | 203136343 U | 8/2013 |
| CN | 105044956 A | 11/2015 |

OTHER PUBLICATIONS

International Search Report dated May 30, 2016 issued in corresponding International Application No. PCT/CN2016/073839 and English translation of Written Opinion of the International Searching Authority.

Placing a display motherboard on a platform of a cutting machine, and forming an aligning mark on a first substrate of the display motherboard

↓

Cutting the display motherboard into a plurality of display panels from a side of the first substrate to a second substrate of the display motherboard, and exposing bonding regions of the second substrate

↓

Simultaneously bonding flexible circuit boards corresponding to the display panels respectively to the bonding regions of the second substrate

MANUFACTURING METHOD OF DISPLAY PANEL AND BONDING CUTTING DEVICE

This is a National Phase Application filed under 35 U.S.C. 371 as a national stage of PCT/CN2016/073839, filed Feb. 16, 2016, an application claiming the benefit of Chinese Application No. 201510566255.9, filed Sep. 8, 2015, the content of each of which is hereby incorporated by reference in its entirety.

FIELD OF THE APPLICATION

The present application relates to a field of display technology, in particular relates to a manufacturing method of a display panel and a bonding cutting device.

BACKGROUND OF THE APPLICATION

Figure 1:
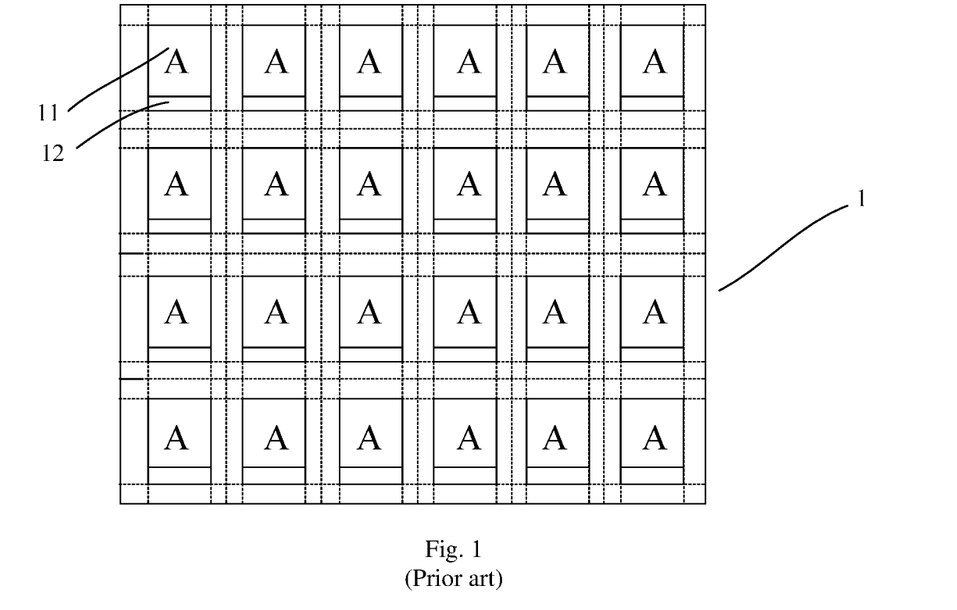
FIG. 1 shows a diagram of a display motherboard in the prior art.

FIG. 1 shows a display motherboard 1 in the prior art. The display motherboard 1 comprises a plurality of display panels divided by cutting lines, and one of the display panels is represented by A in the figure. The plurality of display panels may be separated from each other by cutting the display motherboard along the cutting lines using a cutting knife. Each of the display panels comprises a display region 11 and a bonding region 12. There is no flexible circuit board bonded to the bonding region 12 of any of the display panels obtained by cutting, thus a bonding process is required for each display panel. It should be noted that, a driving integrated chip (IC) is required to be bonded to a flexible circuit board before the flexible circuit board is bonded to the display panel.

Whether to bond the driving IC or the flexible circuit board, an alignment procedure is required (an alignment between the driving IC and the flexible circuit board or an alignment between the flexible circuit board and the display panel). Generally, for each of the display panels, each bonding process for bonding the flexible circuit board or the driving IC requires about 3.5 seconds. If twenty-four display panels are obtained by cutting one display motherboard, one hundred and sixty-eight seconds are required for bonding processes of the twenty-four display panels. For a mass production of display panels, how to save a time needed for the bonding process so as to improve production capacity is a technical problem to be solved.

SUMMARY OF THE APPLICATION

In view of problems existing in a manufacturing method of a display panel in the prior art, embodiments of the present application provide a manufacturing method of a display panel and a bonding cutting device to improve production efficiency.

An aspect of the present application provides a manufacturing method of a display panel, the display panel comprises a display region and a bonding region, and the manufacturing method comprises steps of:

cutting a display motherboard along cutting lines, and simultaneously bonding flexible circuit boards to the bonding regions of the cut display panels corresponding to the flexible circuit boards respectively.

Optionally, the manufacturing method further comprises a step of:

simultaneously bonding driving integrated chips to the flexible circuit boards corresponding to the driving integrated chips respectively while bonding the flexible circuit boards to the bonding regions of the display panels corresponding to the flexible circuit boards respectively.

Optionally, the display motherboard comprises a first substrate and a second substrate which are aligned and combined into a cell, the second substrate of the display motherboard is in contact with a platform of a cutting machine, wherein, the steps of cutting the display motherboard along the cutting lines, and simultaneously bonding the flexible circuit boards to the bonding regions of the display panels corresponding to the flexible circuit boards respectively comprise:

cutting the first substrate along the cutting lines;
simultaneously bonding the flexible circuit boards to the bonding regions of the display panels corresponding to the flexible circuit boards respectively; and
turning over the display motherboard so that the first substrate is in contact with the platform of the cutting machine, and cutting the second substrate along the cutting lines.

Optionally, the display motherboard comprises a first substrate and a second substrate which are aligned and combined into a cell, the second substrate of the display motherboard is in contact with a platform of a cutting machine, wherein, the step of cutting the display motherboard along the cutting lines comprises: cutting the display motherboard into a plurality of display panels from a side of the first substrate to the second substrate along the cutting lines.

Optionally, the manufacturing method further comprises a step of:

forming an aligning mark at a middle position between any two adjacent display panels in a surrounding region of the display motherboard before cutting the motherboard along the cutting lines.

Optionally, the manufacturing method further comprises:

forming at least one round of defining line around the display panel in a cutting region of the display motherboard before cutting the motherboard along the cutting lines.

Further optionally, the at least one round of defining line around the display panel includes two rounds of defining lines around the display panel, and a distance between the two rounds of defining lines is equal to a thickness of a blade of a cutting knife.

Further optionally, a material of the defining line is a fluorescent material.

Another aspect of the present application provides a bonding cutting device for the manufacturing method of the display panel described above, the bonding cutting device comprises a plurality of manipulators and a cutting knife, wherein, the cutting knife is configured to cut the display motherboard into a plurality of display panels along cutting lines;

the plurality of manipulators are configured to bond flexible circuit boards to bonding regions of the display panels corresponding to the flexible circuit boards respectively.

Optionally, each of the manipulators comprises two tentacles, wherein, one of the tentacles is configured to grasp the flexible circuit board, and the other of the tentacles is configured to grasp the driving integrated chip.

Further optionally, the manipulator is provided with an alignment module and a first camera;

the first camera is configured to collect an aligning mark on the display motherboard;

the alignment module is configured to fine-tune the two tentacles in accordance with information collected by the first camera.

Optionally, the cutting knife is provided with a second camera;

the second camera is configured to collect a fluorescence emitted by a fluorescent material.

With the manufacturing method of the display panel provided by embodiments of the present application, flexible circuit boards are respectively bonded to display panels of a same display motherboard by a single bonding process, thus production efficiency of the display panels can be significantly improved.

With the bonding cutting device provided by embodiments of the present application, flexible circuit boards are respectively bonded to display panels of a same display motherboard by a single bonding process, thus production efficiency of the display panels is significantly improved.

Reference signs: 1, display motherboard; 11, display region; 12, bonding region; 13, defining line.

DETAILED DESCRIPTION OF THE EMBODIMENTS

In order to make a person skilled in the art understand technical solutions of the present application better, the present application will be further described in detail in conjunction with drawings and specific implementations.

First Embodiment

The present embodiment provides a manufacturing method of a display panel, the display panel comprises a display region and a bonding region, and the manufacturing method comprises steps of:

cutting a display motherboard along cutting lines, and simultaneously bonding each of flexible circuit boards to the bonding region of a display panel corresponding to the flexible circuit board.

In the manufacturing method of the display panel in accordance with the present embodiment, since flexible circuit boards are respectively bonded to display panels of a same display motherboard by a single bonding process, thus production efficiency of the display panels is significantly improved. Specific details will be illustrated in conjunction with following embodiments.

Second Embodiment

Figure 2:
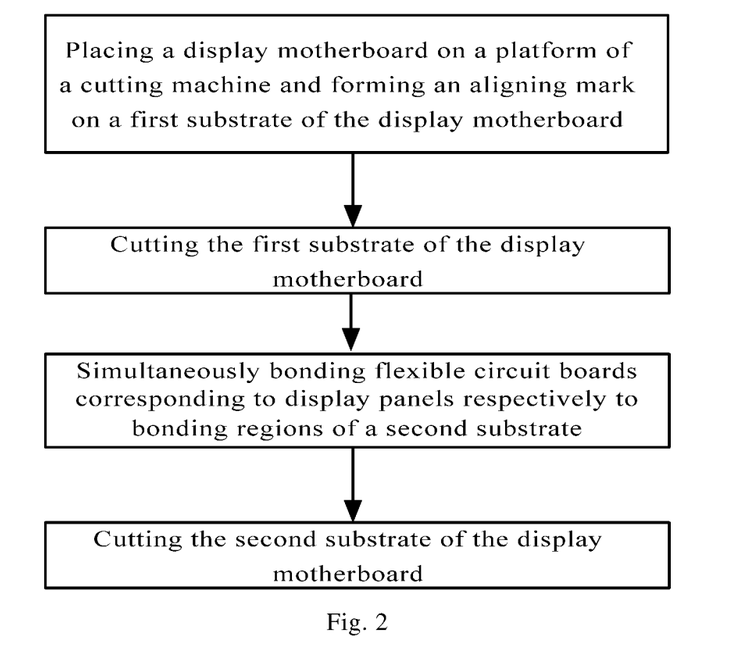
FIG. 2 shows a flowchart of a manufacturing method of a display panel in accordance with a second embodiment of the present application.
Figure 3:
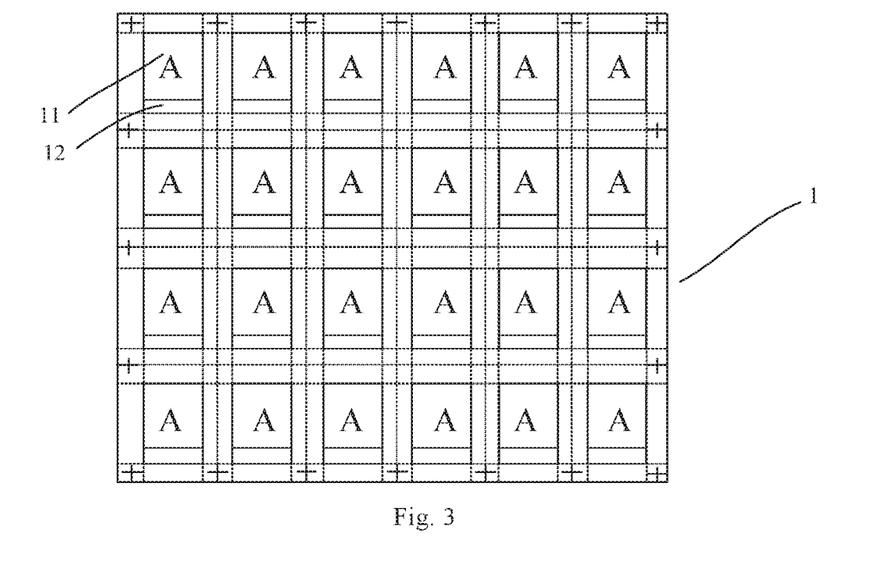
FIG. 3 shows a diagram of a display motherboard in accordance with the second embodiment of the present application.

The present embodiment provides a manufacturing method of a display panel. Hereafter, the manufacturing method is referred to as a first method. FIG. 2 shows a flowchart of the first method, and FIG. 3 shows a diagram of a display motherboard in accordance with the present embodiment. The display motherboard 1 comprises a first substrate and a second substrate which are aligned and combined into a cell, a plurality of display panels A may be obtained by cutting the display motherboard 1. Each of the display panels comprises a display region 11 and a bonding region 12. As shown in FIG. 2, the first method comprises following steps 1 to 4.

Step 1, placing a display motherboard 1 on a platform of a cutting machine (the second substrate of the display motherboard 1 is placed on and in contact with the platform of the cutting machine), and forming an aligning mark at a middle position between any two adjacent display panels in a surrounding region of the display motherboard 1, as shown in FIG. 3; optionally, step 1 may also include: forming an aligning mark at a middle position between any two adjacent display panels in a surrounding region of the display motherboard 1, as shown in FIG. 3, and then placing the display motherboard 1 formed with aligning marks thereon on the platform of the cutting machine in a manner of the second substrate being in contact with the platform of the cutting machine.

Step 2, cutting the first substrate of the display motherboard 1 by a cutting knife.

During a procedure of cutting, a trace that the cutting knife follows to cut the first substrate of the display motherboard 1 is adjusted in accordance with the aligning mark on the display motherboard 1 so that a damage of the display panel caused by cutting the display region 11 of the display panel is avoided. It should be noted that, while cutting the first substrate, a region of the first substrate corresponding to the bonding region 12 is required to be cut off to expose the bonding region 12 of the second substrate.

Step 3, simultaneously bonding, by using manipulators, the flexible circuit boards corresponding to the display panels respectively to corresponding bonding regions 12 on the second substrate.

Optionally, this step further comprises simultaneously bonding driving integrated chips to corresponding flexible circuit boards. It should be understood that, in this step, the number of the tentacles of the manipulator may be equal to a sum of the number of the flexible circuit boards and the number of the driving integrated chips, so that the flexible circuit boards and the driving integrated chips can be simultaneously bonded by a single bonding process, thus production efficiency is significantly improved.

Step 4, integrally turning over the display motherboard 1 so that the first substrate is in contact with the platform of the cutting machine, and cutting the second substrate by the cutting knife, so far the manufacturing of the display panel is completed.

In the first method, the flexible circuit boards and the driving integrated chips are simultaneously bonded by a single bonding process, thus production efficiency is significantly improved; and in the first method, the first substrate of the display motherboard 1 is first cut and then the second substrate is cut, a probability of glass substrates of the display panel being chopped caused by simultaneously cutting the first substrate and the second substrate in a single process is effectively reduced.

Figure 4:
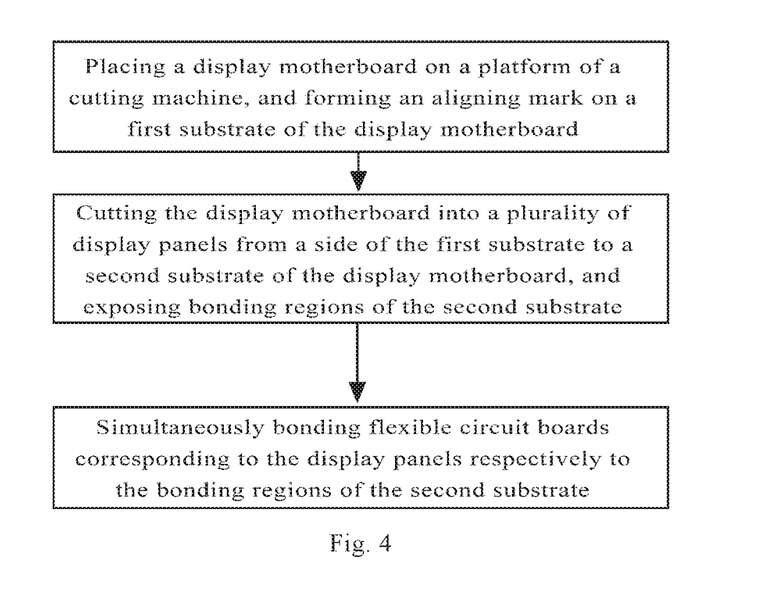
FIG. 4 shows a flowchart of another manufacturing method of a display panel in accordance with the second embodiment of the present application.

The present embodiment also provides another manufacturing method of a display panel. Hereafter, the manufacturing method is referred to as a second method. FIG. 4 shows a flowchart of the second method. The step of bonding the flexible circuit board and the driving integrated chip in the second method is the same as that in the first method. The second method is distinct from the first method in that:

different from that the second substrate is first cut, and then the display motherboard is turned over and the first substrate is cut in the first method, in the second method, first cutting the first substrate and the second substrate of the display motherboard 1 simultaneously by the cutting knife (i.e., directly cutting downwards from a side of the first substrate to the second substrate) so as to cut the display motherboard 1 into a plurality of display panels, and then bonding the flexible circuit boards corresponding to the display panels respectively and the driving integrated chips corresponding to the flexible circuit boards respectively. Other steps of the second method are the same as those in the first method, and will not be described in detail here again.

Correspondingly, the present embodiment also provides a bonding cutting device for the manufacturing method of the display panel described above, and the bonding cutting device comprises a plurality of manipulators and a cutting knife, wherein, the cutting knife is configured to cut the display motherboard 1 into a plurality of display panels along cutting lines; the plurality of manipulators are configured to simultaneously bond flexible circuit boards to bonding regions 12 of the display panels corresponding to the flexible circuit boards respectively. That is to say, the number of the manipulators is equal to the number of the display panels in the display motherboard 1.

Optionally, each of the manipulators comprises two tentacles, wherein, one of the tentacles is configured to grasp the flexible circuit board, and the other of the tentacles is configured to grasp the driving integrated chip.

With the bonding cutting device having such manipulators, flexible circuit boards and driving integrated chips may be simultaneously bonded by a single bonding process, thus production efficiency of the display panels is significantly improved.

Optionally, the manipulator is further provided with an alignment module and a first camera, the first camera is configured to collect an aligning mark on the display motherboard 1; the alignment module is configured to fine-tune the two tentacles in accordance with an information collected by the first camera, so that the flexible circuit boards are more accurately bonded to the bonding regions of the display panels corresponding to the flexible circuit boards respectively and the driving integrated chips are more accurately bonded to the flexible circuit boards corresponding to the driving integrated chips respectively, thus precision of the bonding process is improved.

Third Embodiment

Figure 5:
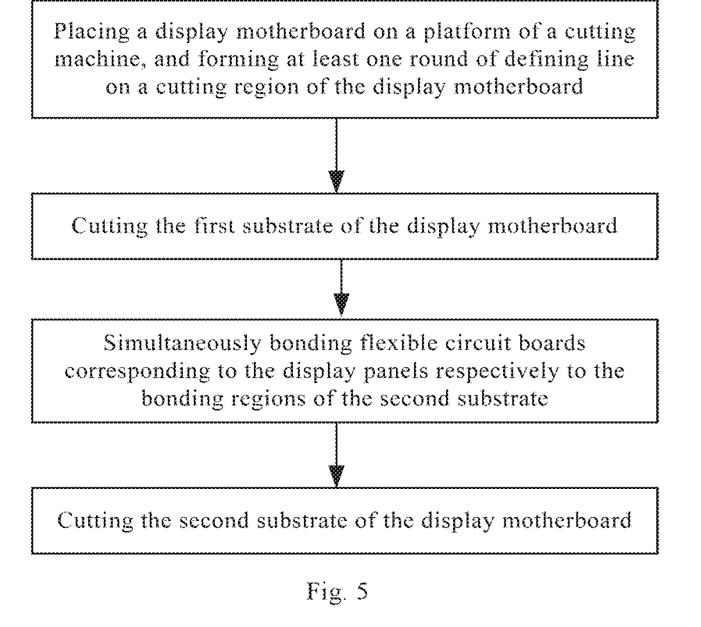
FIG. 5 shows a flowchart of a manufacturing method of a display panel in accordance with a third embodiment of the present application.
Figure 6:
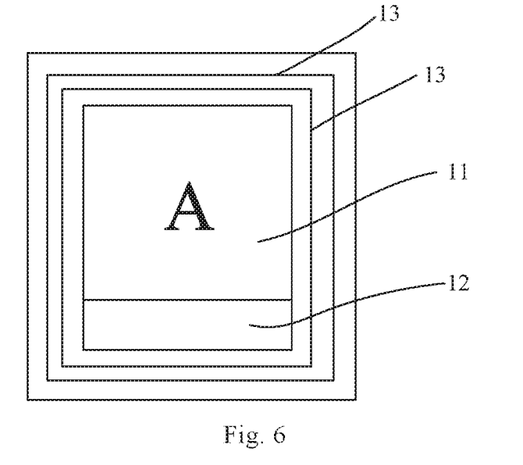
FIG. 6 shows a diagram of a display panel in accordance with the third embodiment of the present application.

The present embodiment provides a manufacturing method of a display panel. Hereafter, the manufacturing method is referred to as a third method. FIG. 5 shows a flowchart of the third method, and FIG. 6 shows a diagram of a display panel in accordance with the present embodiment. The display panel comprises a display region 11 and a bonding region 12, the display motherboard 1 comprises a first substrate and a second substrate which are aligned and combined into a cell. The third method comprises following steps 1 to 4.

Step 1, placing a display motherboard 1 on a platform of a cutting machine (the second substrate of the display motherboard 1 is placed on and in contact with the platform of the cutting machine), and forming at least one round of defining line 13 around the display panel in a cutting region of the display motherboard 1, as shown in FIG. 6; optionally, step 1 may also be: forming at least one round of defining line 13 around the display panel in a cutting region of the display motherboard 1, as shown in FIG. 6, and then placing the display motherboard 1 formed with the defining line 13 on the platform of the cutting machine in a manner of the second substrate being in contact with the platform of the cutting machine.

In this step, optionally, forming two rounds of defining lines 13 around each display panel, and a distance between the two rounds of defining lines 13 may be equal to a thickness of a blade of the cutting knife so that the cutting process is more precise. A material of the defining line 13 may be a fluorescent material, in this case, the cutting knife may be provided with a camera thereon, and the camera can capture a fluorescence emitted by a fluorescent material, thus phenomenon of false cutting may be further avoided.

Step 2, cutting the first substrate of the display motherboard 1 by the cutting knife.

During a procedure of cutting, a trace that the cutting knife follows to cut the first substrate of the display motherboard 1 is adjusted in accordance with the defining line 13 on the display motherboard 1 so that a damage of the display panel caused by cutting the display region 11 of the display panel is avoided. It should be noted that, while cutting the first substrate, a region of the first substrate corresponding to the bonding region 12 is required to be cut off to expose the bonding region 12 of the second substrate.

Step 3, simultaneously bonding the flexible circuit boards corresponding to the display panels respectively to corresponding bonding regions 12 on the second substrate by using the manipulators.

Optionally, this step further comprises simultaneously bonding driving integrated chips to corresponding flexible circuit boards. It should be understood that, in this step, the number of the tentacles of the manipulators may be equal to a sum of the number of the flexible circuit boards and the number of the driving integrated chips, so that the flexible circuit boards and the driving integrated chips can be simultaneously bonded by a single bonding process, thus production efficiency is significantly improved.

Step 4, integrally turning over the display motherboard 1 so that the first substrate is in contact with the platform of the cutting machine, and cutting the second substrate by the cutting knife, so far the manufacturing of the display panel is completed.

In the third method, the flexible circuit boards and the driving integrated chips are simultaneously bonded by a single bonding process, thus production efficiency is significantly improved; and in the third method, the first substrate of the display motherboard 1 is first cut and then the second substrate is cut, a probability of glass substrates of the display panel being chopped caused by simultaneously cutting the first substrate and the second substrate in a single process is effectively reduced.

Figure 7:
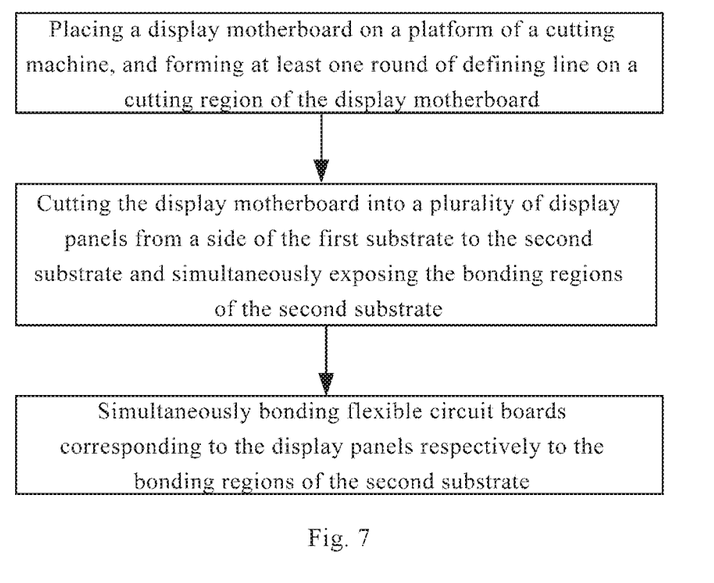
FIG. 7 shows a flowchart of another manufacturing method of a display panel in accordance with the third embodiment of the present application.

The present embodiment also provides another manufacturing method of a display panel. Hereafter, the manufacturing method is referred to as a fourth method. FIG. 7 shows a flowchart of the fourth method. The step of bonding the flexible circuit boards and the driving integrated chips in the fourth method is the same as that in the third method. The fourth method is distinct from the third method in that:

different from that the second substrate is first cut, and then the display motherboard is turned over and the first substrate is cut in the third method, in the fourth method, first cutting the first substrate and the second substrate of the display motherboard 1 simultaneously by the cutting knife (i.e., directly cutting downwards from a side of the first substrate to the second substrate) so as to cut the display motherboard 1 into a plurality of display panels and simultaneously expose the bonding regions of the second substrate, and then bonding, by using manipulators, the flexible circuit boards corresponding to the display panels respectively and the driving integrated chips corresponding to the flexible circuit boards respectively to the bonding regions 12 of the second substrate. Other steps of the fourth method are the same as those in the third method, and will not be described in detail here again.

Correspondingly, the present embodiment also provides a bonding cutting device for the manufacturing method of the display panel described above, and the bonding cutting device comprises a plurality of manipulators and a cutting knife, wherein, the cutting knife is configured to cut the display motherboard 1 into a plurality of display panels along cutting lines; the plurality of manipulators are configured to simultaneously bond flexible circuit boards to bonding regions 12 of the display panels corresponding to the flexible circuit boards respectively. That is to say, the number of the manipulators is equal to the number of the display panels in the display motherboard 1.

Optionally, each of the manipulators comprises two tentacles, wherein, one of the tentacles is configured to grasp the flexible circuit board, and the other of the tentacles is configured to grasp the driving integrated chip.

With the bonding cutting device having such manipulators, flexible circuit boards and driving integrated chips are simultaneously bonded by a single bonding process, thus production efficiency of the display panels is significantly improved.

Optionally, the manipulator is further provided with an alignment module and a first camera, the first camera is configured to collect an aligning mark on the display motherboard 1; the alignment module is configured to fine-tune the two tentacles in accordance with an information collected by the first camera, so that the flexible circuit boards are more accurately bonded to the bonding regions of the display panels corresponding to the flexible circuit boards respectively and the driving integrated chips are more accurately bonded to the flexible circuit boards corresponding to the driving integrated chips respectively, thus precision of the bonding process is improved.

Optionally, the cutting knife in the present embodiment is also provided with a second camera for collecting a fluorescence emitted by a fluorescence material, so that phenomenon of false cutting is further avoided.

It should be understood that, the embodiments described above are merely exemplary embodiments for describing the principle of the present application, but the present application is not limited thereto. For a person of ordinary skill in the art, various variations or improvements of technical solutions can be made without departing from the spirit and essence of the present application, and these variations and improvements shall also be regarded as falling into the protection scope of the present application.

The invention claimed is:

1. A manufacturing method of a display panel, the display panel comprises a display region and a bonding region, and the manufacturing method comprises steps of:
   cutting a display motherboard along cutting lines, and simultaneously bonding flexible circuit boards to bonding regions of the cut display panels corresponding to the flexible circuit boards respectively.

2. The manufacturing method of claim 1, further comprising a step of:
   simultaneously bonding driving integrated chips to the flexible circuit boards corresponding to the driving integrated chips respectively while bonding the flexible circuit boards to the bonding regions of the display panels corresponding to the flexible circuit boards respectively.

3. The manufacturing method of claim 1, wherein the display motherboard comprises a first substrate and a second substrate which are aligned and combined into a cell, the second substrate of the display motherboard is in contact with a platform of a cutting machine, and wherein,
   the steps of cutting the display motherboard along the cutting lines, and simultaneously bonding the flexible circuit boards to the bonding regions of the display panels corresponding to the flexible circuit boards respectively comprise:
   cutting the first substrate along the cutting lines;
   simultaneously bonding the flexible circuit boards to the bonding regions of the display panels corresponding to the flexible circuit boards respectively; and
   turning over the display motherboard so that the first substrate is in contact with the platform of the cutting machine, and cutting the second substrate along the cutting lines.

4. The manufacturing method of claim 1, wherein the display motherboard comprises a first substrate and a second substrate which are aligned and combined into a cell, the second substrate of the display motherboard is in contact with a platform of a cutting machine, wherein,
   the step of cutting the display motherboard along the cutting lines comprises: cutting the display motherboard into a plurality of display panels from a side of the first substrate to the second substrate along the cutting lines.

5. The manufacturing method of claim 1, further comprising a step of:
   forming an aligning mark at a middle position between any two adjacent display panels in a surrounding region of the display motherboard before cutting the motherboard along the cutting lines.

6. The manufacturing method of claim 1, further comprising:
   forming at least one round of defining line around the display panel in a cutting region of the display motherboard before cutting the motherboard along the cutting lines.

7. The manufacturing method of claim 6, wherein, the at least one round of defining line around the display panel includes two rounds of defining lines around the display panel, and a distance between the two rounds of defining lines is equal to a thickness of a blade of a cutting knife.

8. The manufacturing method of claim 6, wherein a material of the defining line is a fluorescent material.

9. The manufacturing method of claim 2, wherein the display motherboard comprises a first substrate and a second substrate which are aligned and combined into a cell, the second substrate of the display motherboard is in contact with a platform of a cutting machine, and wherein, the steps of cutting the display motherboard along the cutting lines, and simultaneously bonding the flexible circuit boards to the bonding regions of the display panels corresponding to the flexible circuit boards respectively comprise:

cutting the first substrate along the cutting lines;

simultaneously bonding the flexible circuit boards to the bonding regions of the display panels corresponding to the flexible circuit boards respectively; and turning over the display motherboard so that the first substrate is in contact with the platform of the cutting machine, and cutting the second substrate along the cutting lines.

10. The manufacturing method of claim 2, wherein the display motherboard comprises a first substrate and a second substrate which are aligned and combined into a cell, the second substrate of the display motherboard is in contact with a platform of a cutting machine, wherein, the step of cutting the display motherboard along the cutting lines comprises: cutting the display motherboard into a plurality of display panels from a side of the first substrate to the second substrate along the cutting lines.

11. The manufacturing method of claim 2, further comprising a step of:

forming an aligning mark at a middle position between any two adjacent display panels in a surrounding region of the display motherboard before cutting the motherboard along the cutting lines.

12. The manufacturing method of claim 3, further comprising a step of:

forming an aligning mark at a middle position between any two adjacent display panels in a surrounding region of the display motherboard before cutting the motherboard along the cutting lines.

13. The manufacturing method of claim 4, further comprising a step of:

forming an aligning mark at a middle position between any two adjacent display panels in a surrounding region of the display motherboard before cutting the motherboard along the cutting lines.

14. The manufacturing method of claim 2, further comprising:

forming at least one round of defining line around the display panel in a cutting region of the display motherboard before cutting the motherboard along the cutting lines.

15. The manufacturing method of claim 3, further comprising:

forming at least one round of defining line around the display panel in a cutting region of the display motherboard before cutting the motherboard along the cutting lines.

16. The manufacturing method of claim 4, further comprising:

forming at least one round of defining line around the display panel in a cutting region of the display motherboard before cutting the motherboard along the cutting lines.

* * * * *